United States Patent

Kaufman

[11] Patent Number: 5,288,247
[45] Date of Patent: Feb. 22, 1994

[54] GROUNDING SHROUD FOR AN ELECTRICAL CONNECTOR

[75] Inventor: John W. Kaufman, Hershey, Pa.

[73] Assignee: The Whitaker Corporation, Wilmington, Del.

[21] Appl. No.: 12,115

[22] Filed: Feb. 1, 1993

Related U.S. Application Data

[63] Continuation-in-part of Ser. No. 926,628, Aug. 10, 1992, and a continuation-in-part of Ser. No. 986,660, Dec. 8, 1992.

[51] Int. Cl.5 .......................................... H01R 13/648
[52] U.S. Cl. ..................................... 439/607; 439/101
[58] Field of Search ............... 439/101, 92, 108, 95, 439/607, 609, 629-635, 79, 636-637

[56] References Cited

U.S. PATENT DOCUMENTS

| | | | |
|---|---|---|---|
| 3,775,643 | 11/1973 | Schachnow et al. | 317/101 |
| 3,932,016 | 1/1976 | Ammenheuser | |
| 4,046,443 | 9/1977 | Champagne | |
| 4,583,807 | 4/1986 | Kaufman et al. | |
| 4,732,365 | 3/1988 | Kloster | 254/10.5 |
| 4,756,696 | 7/1988 | Whiteman, Jr. | 439/79 |
| 4,846,727 | 7/1989 | Glover et al. | 439/608 |
| 4,861,277 | 8/1989 | Bina | 439/377 |
| 4,941,841 | 7/1990 | Darden et al. | 439/377 |
| 4,952,161 | 8/1990 | Komatsu | 439/155 |
| 4,992,052 | 2/1991 | Verhoeven | 439/62 |
| 5,035,631 | 7/1991 | Piorunneck et al. | 439/108 |
| 5,040,999 | 8/1991 | Collier | 439/108 |
| 5,051,101 | 9/1991 | Komatsu | 439/159 |
| 5,195,899 | 3/1993 | Yatsu et al. | 439/101 |

OTHER PUBLICATIONS

Memory/PC Card Connector (Compatible with PCMCIA, Release 2.0; AMP Incorporated; Dec. 1991.
PC Card Standard, Release 2.0, Personal Computer Memory Card International Association (PCMCIA); Sep. 1991.
InterConnection Technology, IHS Group Publication; *Surface Mount Connector Hold Downs;* Aug. 1992.
Technical Paper; AMP; *Surface Mount Connector Hold Downs;* By: Henry B. Collins and Tim Kocher; Copyright 1991, by AMP Incorporated.

*Primary Examiner*—Larry I. Schwartz
*Assistant Examiner*—Khiem Nguyen

[57] ABSTRACT

An electrical connector (1) comprises; a housing (2), a card receiving mouth (3), electrical contacts (4), prong receiving sockets (26) on the housing, (2) card guide arms (5, 6), a prong (25) on each of the guide arms (5, 6) for locking engagement with any one of the sockets (26), and a mounting bracket (64) engaging a ground plane (74) on a memory card (73) and being shunted to a ground plane on a circuit board (9).

11 Claims, 5 Drawing Sheets

GROUNDING SHROUD FOR AN ELECTRICAL CONNECTOR

CROSS REFERENCE TO RELATED APPLICATION

This application is a continuation-in-part of application Ser. No. 07/926,628, filed Aug. 10, 1992, and a continuation-in-part of application Ser. No. 07/986,660, filed Dec. 8, 1992.

FIELD OF THE INVENTION

The invention relates to an external ground referencing plane for increasing a ratio of ground to signal in an electrical connector for a card reader, and more particularly, to a conductive shroud for increasing the ground to signal ratio in an electrical connector that accepts two types of cards, one of which cards requires an increased ground to signal ratio in the connector, and the other of which cards does not.

BACKGROUND OF THE INVENTION

A known electrical connector, disclosed in U.S. Pat. No. 4,952,161, comprises, a card connector having card guide grooves for guiding a card. The card contains an electronic memory which can be accessed electronically by plugging the card into electrical contacts in the electrical connector.

The electrical contacts are spaced apart from one another to isolate one contact from another, and to prevent electrical inductance and capacitance influences among the contacts. When spacing between the contacts is inadequate to avoid electrical influences among the contacts, it would be desirable to couple the contacts with a ground referencing plane. One reason to do so is described in U.S. Pat. No. 4,846,727, to Douglas W. Glover and Richard F. Granitz, wherein, a conductive plate is positioned along a row of signal conductors in a connector to provide a low impedance return path referenced to ground electrical potential. In providing a conductive ground referencing plane in a connector for a card reader, it is desired that the connector retain a capacity to connect with cards which are already in widespread use, and also have the capacity to connect with new, improved cards that require the connector to have an increased ground to signal ratio.

SUMMARY OF THE INVENTION

According to the invention, a ground referencing plane on a connector for a card reader provides a low impedance return path that increases the ground to signal ratio of the connector.

A feature of the invention resides in a ground reference plane extended into a connector of a card reader to connect with a card when the card is externally conductive. The connector is capable of use with a card that requires the ground reference plane internally of the connector to increase the ground to signal ratio, and to provide a low impedance return path for the contacts in the connector and for the card when the card is inserted into the connector and connected to the contacts. The connector is also capable of use with a card that does not carry the ground reference plane into the connector.

A connector having a feature of the invention comprises, an insulative housing with conductive electrical contacts extending in a card receiving mouth in the housing, a conductive shroud covering the housing, a ground reference plane on the shroud extending along the housing, spring contacts extending from the shroud into the mouth, and the spring contacts being spaced apart from the contacts to engage frictionally against a surface on a card received by the mouth, and to connect electrically with the surface of the card when the surface of the card is conductive electrically, whereby the ground to signal ratio of the connector is increased, and the surface of the card electrically connects to the ground reference plane in the mouth of the connector.

DESCRIPTION OF THE DRAWINGS

An embodiment of the invention will now be described by way of example with reference to the accompanying drawings in which.

DETAILED DESCRIPTION

Figure 1:
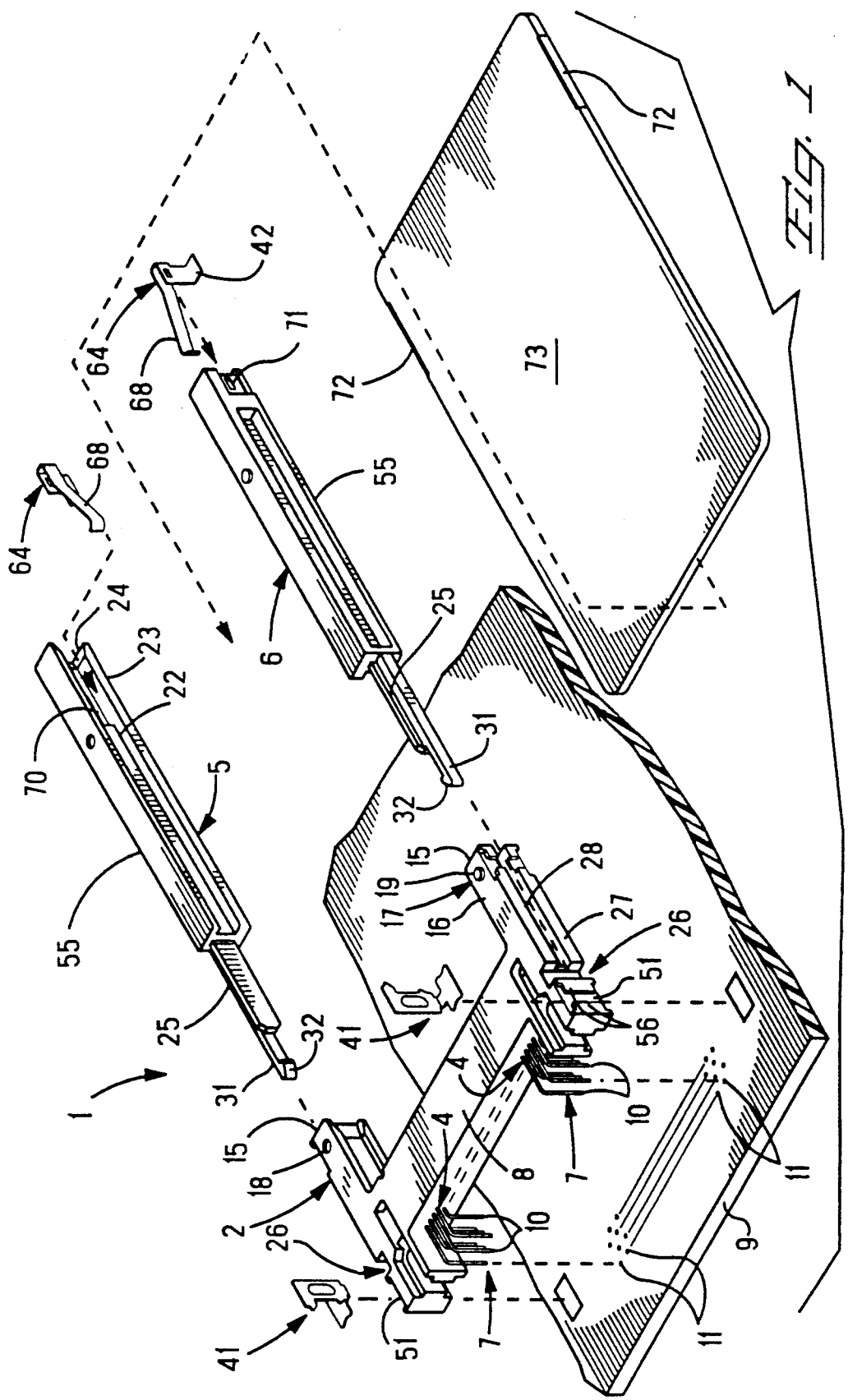
FIG. 1 is a perspective view of an electrical connector having a housing and a set of card guide arms for a single card, together with mounting brackets, electrical grounding contacts and a circuit board.
Figure 2:
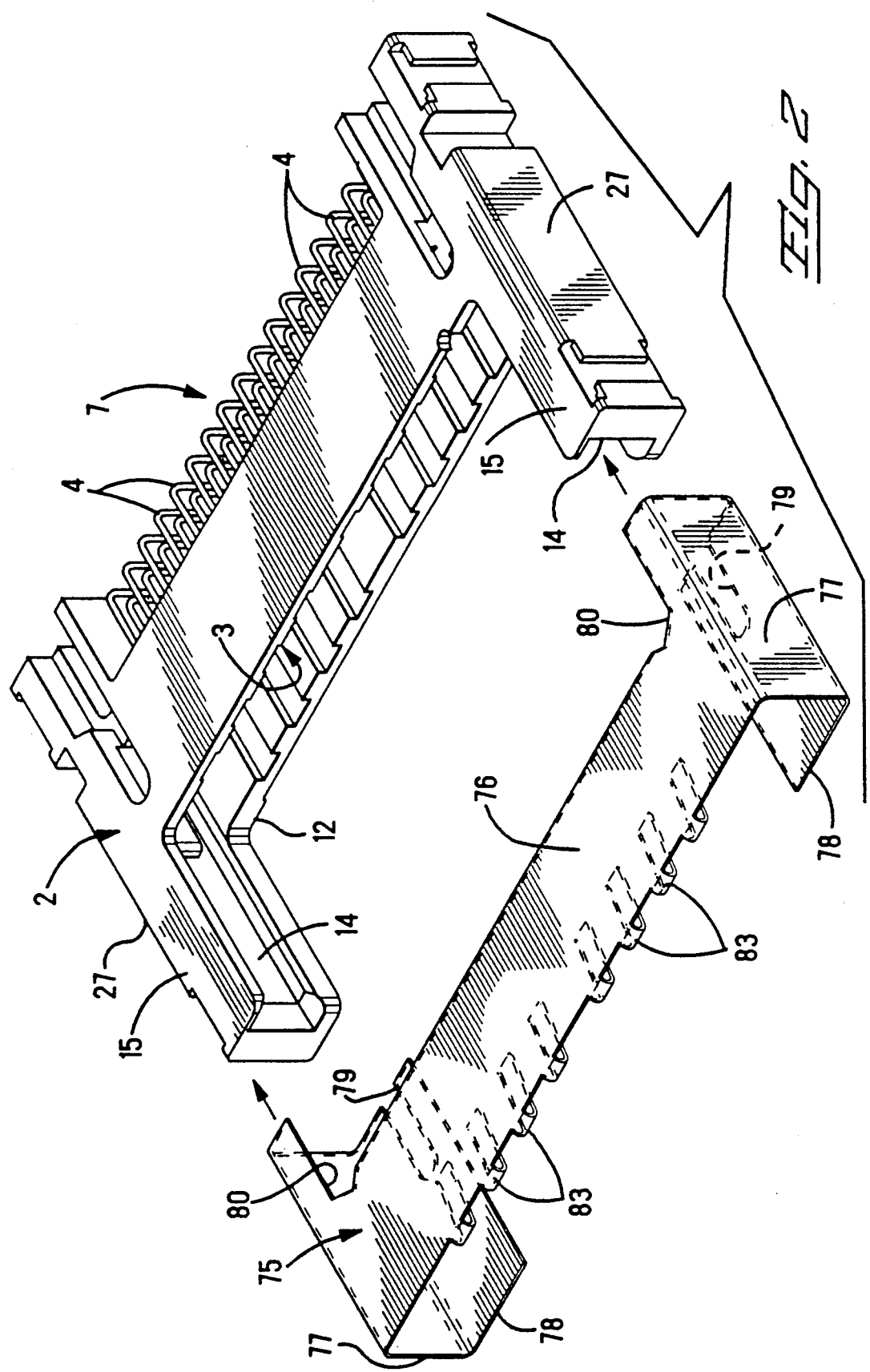
FIG. 2 is a perspective view of the connector shown in FIG. 1 with a conductive shroud.

With reference to FIG. 1, an electrical connector 1, especially suitable for use in a card reader, not shown, includes an insulating housing 2 having a card receiving mouth 3, FIG. 2, multiple electrical contacts 4 held by the housing 2 extending in two rows and into the mouth 3, and a set of card guide arms 5, 6. Tail sections 7 of the contacts 4 extend outwardly of a rear surface 8 of the housing 2 for connection to a first circuit board 9. Feet 10 on free ends of the contacts 4 are adapted with respective shapes for connection to the circuit board 9. For example, the feet 10 are shaped as posts for insertion into plated apertures 11 of the circuit board 9. Alternatively, the feet 10 can be shaped as surface mount flat portions, not shown, for connection to surface mount pads, not shown, on the circuit board 9. A bottom surface 12 is on the housing 2. The housing 2 has starter grooves 14 in forwardly projecting housing arms 15 on opposite sides of the mouth 3. A top surface 16 of the housing 2 has a locking structure 17 in the form of a recess 18 on one side flanking the mouth 3, and a projecting knob 19 in another side flanking the mouth 3. Duplicate housings 2 can be stacked and interlocked, when inverted with respect to each other, with the recess 18 of each housing receiving the knob 19 of the other housing.

The guide arms 5, 6 are of unitary construction molded from a thermoplastic material. FIG. 1, card receiving grooves 22 on inside surfaces 23 extend along lengths of the respective guide arms 5, 6. Flared, groove mouths 24 at respective ends of the guide arms 5, 6 open into respective grooves 22 of the guide arms 5, 6. At opposite ends of respective guide arms 5, 6, respective elongated prongs 25 extend outwardly.

The prongs 25 lockingly engage in sockets 26, the sockets 26 being in respective, exterior side surfaces 27 of the housing 2 flanking the mouth 3. The prongs 25 have respective cross sections that interfit slidably along grooves 28 in the respective, exterior side surfaces 27 of the housing 2. Ends of the prongs 25 have respective locking latches 31 with transverse, projecting fingers 32. The fingers 32 are forced to bend resiliently as they traverse in respective grooves 28, until the fingers 32 emerge from ends of the grooves 28 and unbend to latch in the sockets 26.

With reference to FIG. 1, a mounting bracket 41 is inserted along each one of multiple channels 51 recessed in each of the side surfaces 27 of the housing 2. Flanges 56 overhang opposite sides of each channel 51, to overlap edges of a mounting bracket 41 in the channel 51. The guide arms 5, 6 are each assembled with mounting brackets 64. The mounting brackets 64 are constructed with the identity of one another, except in mirror image of one another. An elongated, resilient spring finger 68 is bent to extend diagonally into a groove 22 of either the guide arm 5 or the guide arm 6. The spring finger 68 is bent to extend diagonally into the groove 22 to engage an edge 72 of a memory card 73 slidably received along the groove 22.

The card receiving mouth 3 is adapted to receive a memory card 73 known in the industry, and disclosed, for example, in U.S. Pat. No. 5,033,972. In particular, a ground plane on an exterior of the memory card 73 extends along the edge 72, and provides a conductive shield that protects circuitry and electronics in the memory card 73 from electrical influences due to electromagnetic interference, EMI, and electrostatic discharge, ESD. The spring finger 68 frictionally engages the ground plane 74 of a memory card 73 in the connector 1. The mounting bracket 64 electrically connects the ground plane 74 of the memory card 73 to a ground plane on the circuit board 9. Thereby, when the memory card 73 is grasped, during its insertion or removal with respect to the connector 1, ESD or EMI induced voltages are shunted electrically through the mounting bracket 64 to a ground plane on the circuit board 9.

With reference to FIGS. 2, 3, 5 and 6, the connector 1 is further adapted with a conductive shroud 75 of unitary construction, stamped and formed from a metal plate. The shroud 75 has a planar top plate 76 overlying the top surface 16 of the housing, and depending sidewalls 77 that wrap around the side surfaces 27 of the housing 2, and planar flanges 78 overlapping the bottom surface 12 of the housing 2 where the bottom surface 12 joins the side surfaces 27. The flanges 78 serve as conductive pads that can be secured and referenced to ground electrical potential by being electrically connected to conductive pads, not shown, on the circuit board 9, either by direct soldering, or by high contact pressure applied by fasteners, not shown, mounted along open end slots 79 in the flanges 78. Open end notches 80 in the top plate align with openings through the housing 2 to accept fasteners, not shown, to attach the shroud and the housing 2 to a ground reference on the circuit board 9.

Figure 5:
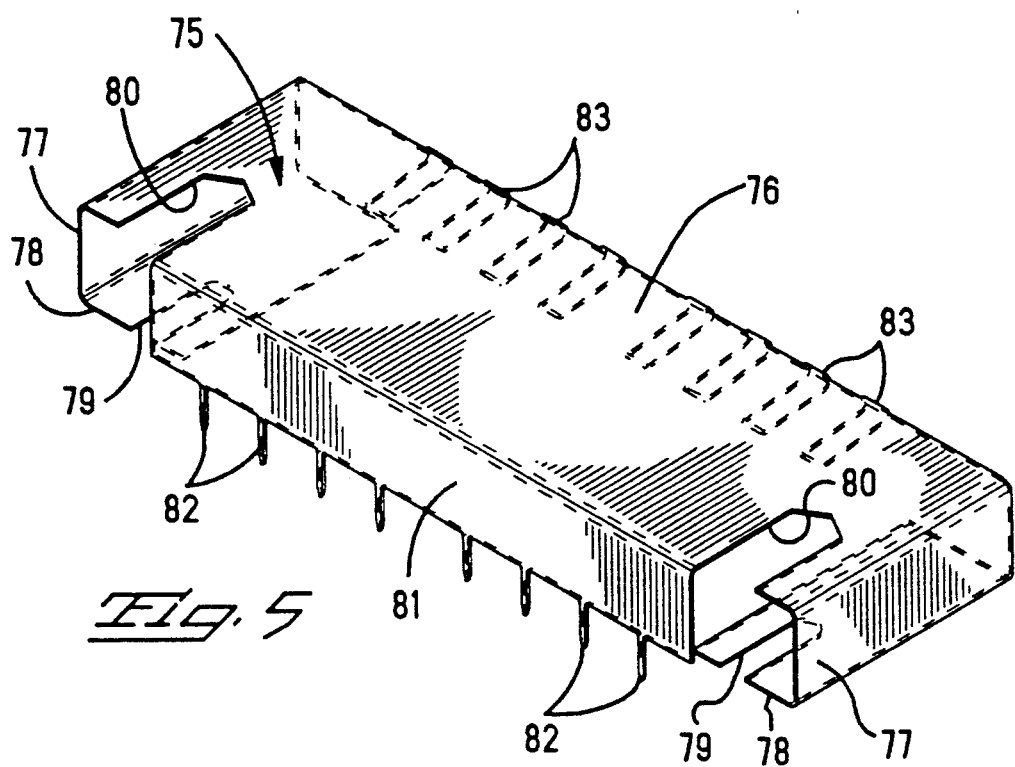
FIG. 5 is a perspective view of another shroud.
Figure 6:
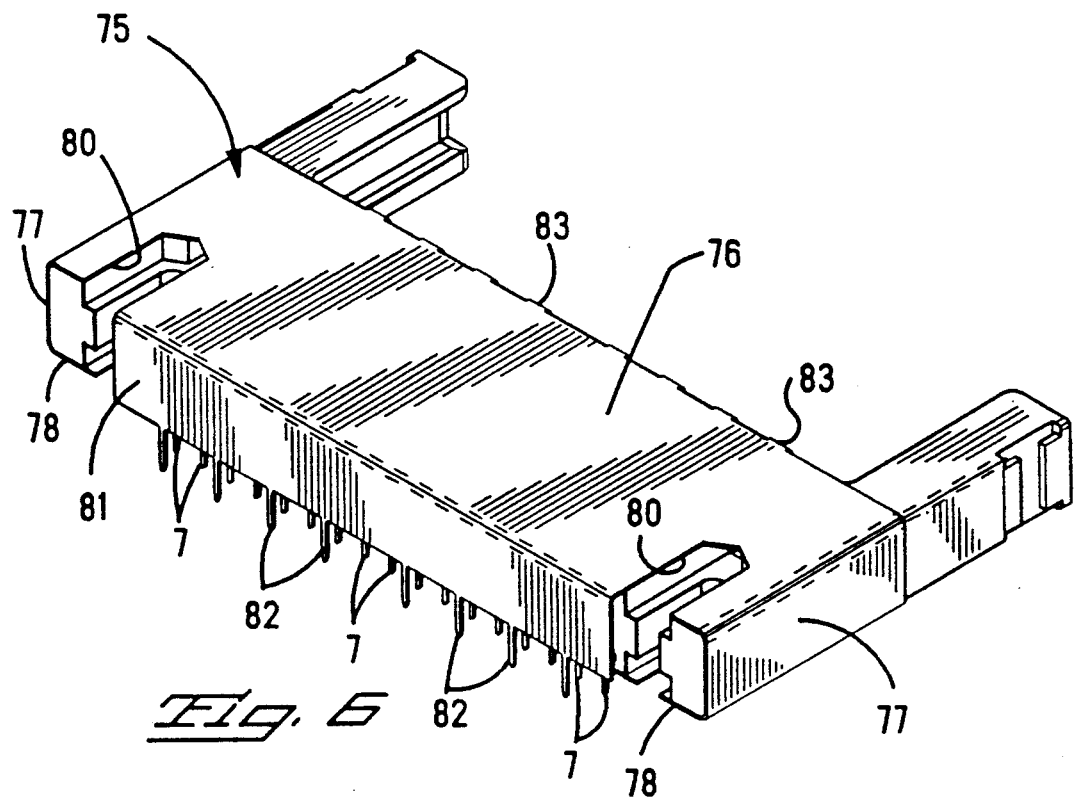
FIG. 6 is a perspective view of the shroud shown in FIG. 5 assembled to a connector.

In an alternative embodiment, FIGS. 5 and 6, a back wall 81 depends from the top plate 76 and envelops the tail sections 7 of the contacts 4 where they emerge from the housing 2, and are bent to extend through an apertured alignment block 13, and toward the circuit board 9. Multiple terminals 82 in the form of posts are unitary with the back wall 81 and are adapted to connect in plated apertures, not shown, in the circuit board 9 and referenced to ground electrical potential. The shroud 75 provides a ground reference plane via the top plate 76 and its connection to ground return paths on the circuit board 9. Multiple, resilient spring contact fingers 83 extend the ground reference plane into the mouth 3 of the connector 1.

Figure 3:
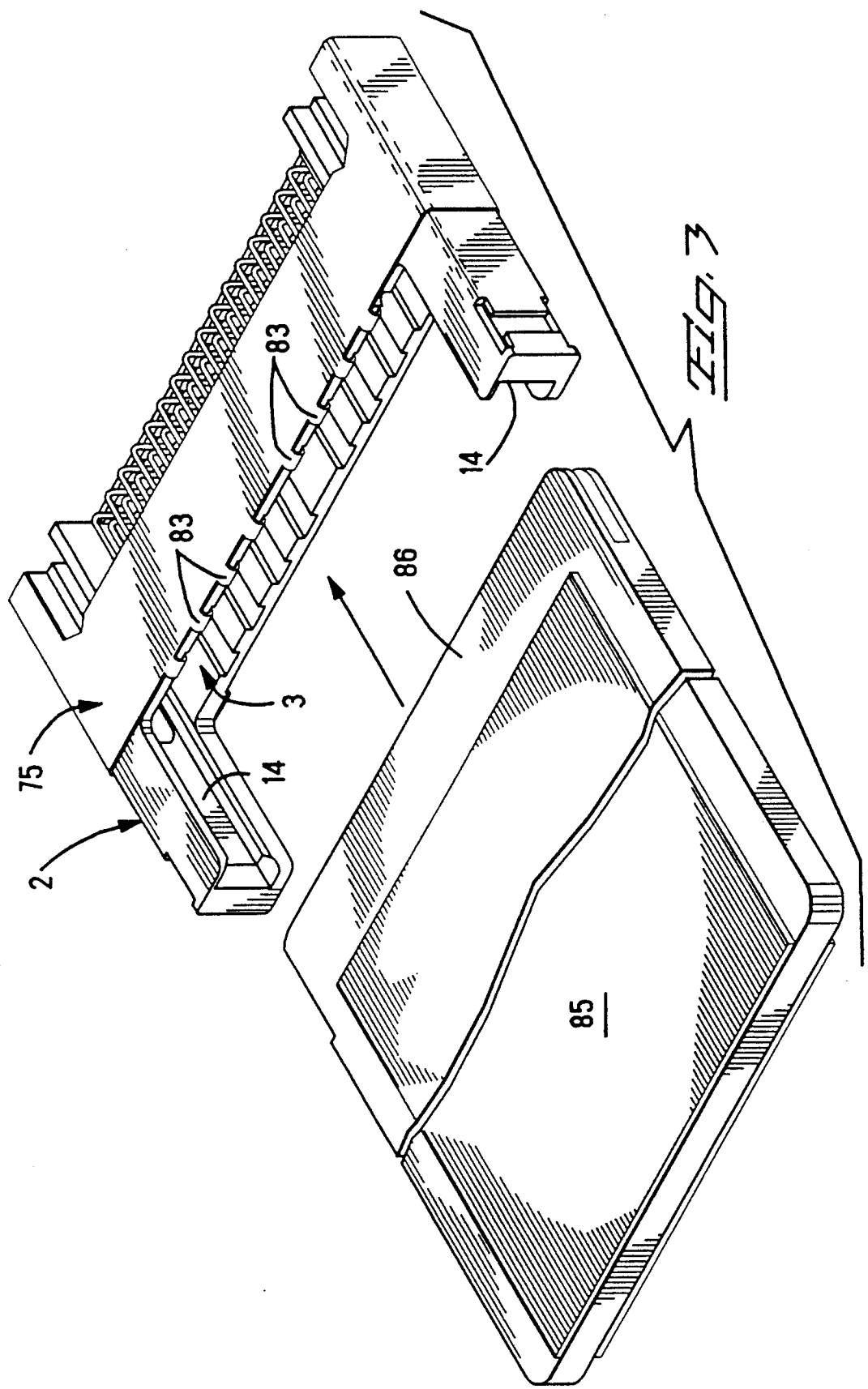
FIG. 3 is a view similar to FIG. 2, illustrating the connector and shroud with an improved card.
Figure 4:
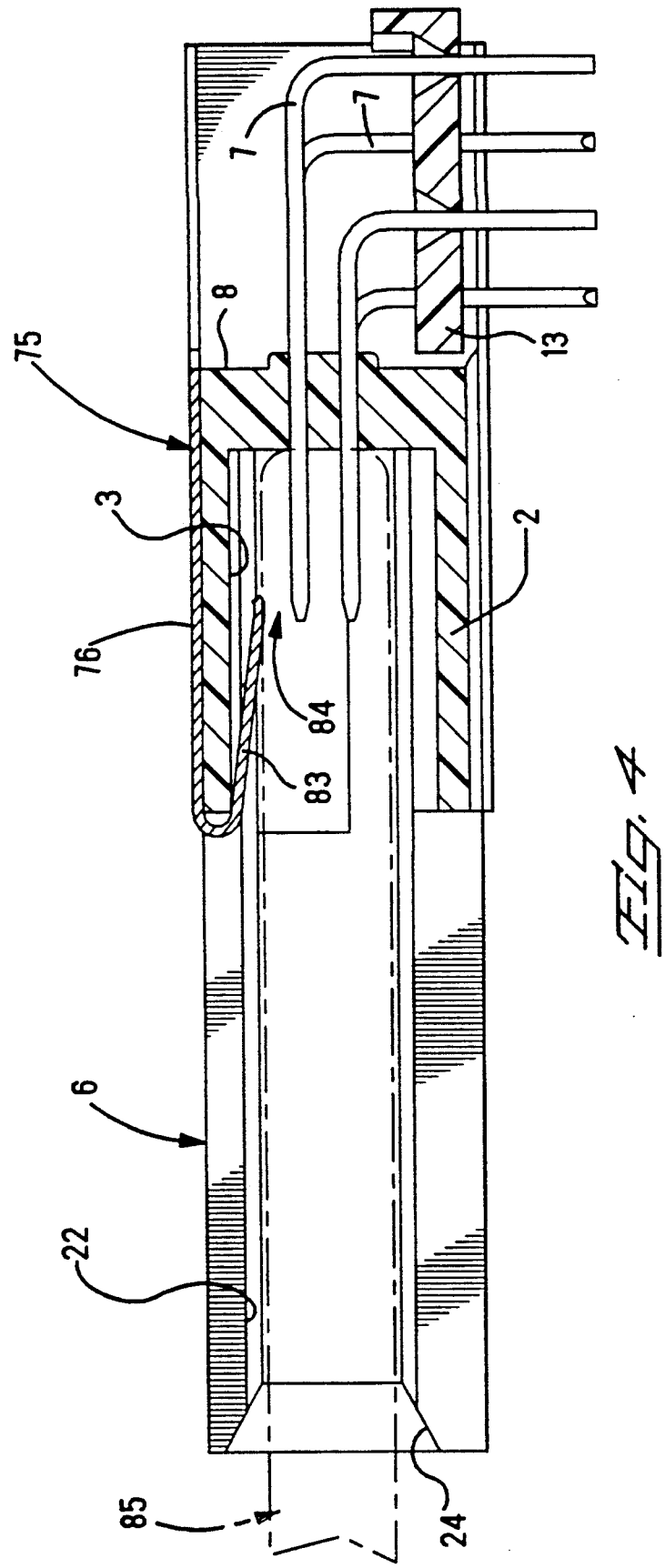
FIG. 4 is a section view of the connector and shroud.

The spring contact fingers 83 project from the top plate 76 and into the mouth 3 of the housing 2, FIGS. 3 and 4. The spring contact fingers 83 are bent to extend into an open front end of the mouth 3. The spring contact fingers 83 extend in the mouth 3, from front to rear, parallel to the contacts 4 in the mouth 3. By extending the ground reference plane into the housing 2 alongside the contacts 4, the connector 1 has an increased ground to signal ratio. The spring contact fingers 83 extend within the mouth 3 and define a card receiving space 84, FIG. 4, between the spring contact fingers 83 and the contacts 4 in the mouth 3. The card receiving space 84 is widened by biasing the spring contact fingers 83 away from, relative to, the contacts 4 in the mouth 3.

When the card 73 is inserted into the mouth 3, of a connector 1 without the shroud 75, as shown in FIG. 1. The card 73 may also be inserted into the connector 1 with the shroud 75. The card 73 connects to the contacts 4, enabling mating, electrical connection to the memory contained in the card 73. In providing a conductive ground referencing plane in a connector for a card reader, it is desired that the connector 1 retain a capacity to connect with cards 73 which are already in widespread use, and also have the capacity to connect with a new, improved card 85, FIG. 3, that requires the connector 1 to have an increased ground to signal ratio. The improved card 85 has an electrically conductive surface 86 on an area extending from side to side at a front of the card 85. The card 85 has the same exterior shape and dimensions as the card 73, such that either card 73 or 85 can be inserted along the mouth 3 of the connector 1 having the shroud 75. The card 73 or 85 is further removable from the connector 1 and from the rails 5, 6 subsequent to connection with the contacts 4 of the connector 1.

For example, FIG. 4 shows the card 85 in phantom outline inserted in the mouth 3 of the connector 1 for mated connection with the contacts 4. Either the card 85 or the card 73 can be inserted in and received by the mouth 3 for mated connection with the contacts 4. The spring contact fingers 83 wipe frictionally against a surface on a card 73 or 85 received by the mouth 3. The surface of the card 73 or 85 biases the spring contact fingers 83 away from, relative to, the contacts 4 and widens the space 84. When the improved card 85 is inserted into the mouth 3 of the housing 2, the conductive surface 86 on the card 85 electrically engages the ground reference plane in the mouth 3, by wiping against and biasing the spring contact fingers 83 away from, relative to, the contacts 4. Electrical connections are established between the spring contact fingers 83 and the conductive surface 86 of the improved card 85 to connect electrically the shroud 75 and the surface of the card 85. Because the surface 86 of the card 85 is conductive electrically, the surface 86 of the card 85 extends the ground reference plane into the mouth 3. The spring contact fingers 83 and the remainder of the shroud 75 provide a low impedance return path, referenced to ground, connected to the conductive surface 86 on the improved card 83.

According to an advantage of the invention, a conductive shroud 75 for a connector 1 for a card reader extends into the connector 1 and provides a low impedance return path for a conductive surface of a card received by the connector 1.

According to another advantage of the invention, a conductive ground reference plane increases a ground to signal ratio for an electrical connector 1.

Other embodiments of the invention and modifications of the invention are intended to be covered by the spirit and scope of the claims defining the invention.

I claim:

1. An electrical connector for a card reader, comprising: an insulative housing with conductive electrical contacts extending in a card receiving mouth in the housing, a conductive shroud encircling the housing, spring contact fingers extending from the shroud into the mouth, a ground reference plane extending along the shroud and along the spring contact fingers, a card receiving space in the mouth between the spring contact fingers and the contacts, the spring contact fingers being spaced apart from the contacts to engage frictionally against a surface on a card receiving by the card receiving space, and to connect electrically with the surface of the card when the surface of the card is conductive electrically, and the spring contact fingers being constructed for deflection away from the contacts by a card received in the card receiving space, whereby the card receiving space is widened.

2. An electrical connector as recited in claim 1, wherein, the spring contact fingers project into an open end of the mouth.

3. An electrical connector as recited in claim 1, comprising: conductive pads on the shroud constructed for connection to a circuit board.

4. An electrical connector as recited in claim 1, wherein, the contacts are arranged in two rows within the mouth, and the fingers are adjacent to one of the rows and provide a low impedance return path within the mouth.

5. An electrical connector as recited in claim 1, comprising: conductive pads on the shroud constructed for connection to a circuit board.

6. A conductive, low impedance return path in combination with electrical contacts in an insulative housing of an electrical connector, comprising: a conductive plate externally of the housing, conductive spring contact fingers on the plate extending into a mouth of the housing, the electrical contacts extending in the mouth, and a removable card connected to the contacts and having a conductive surface beside each of the contacts, the conductive surface being biased frictionally against the spring contact fingers, the conductive plate and the conductive surface beside each of the contacts in the mouth providing a low impedance return path, a card receiving space between the spring contact fingers and the contacts in the mouth, and the card receiving space being widened by a card in the card receiving space biasing the spring contact fingers away from the contacts.

7. An electrical connector as recited in claim 6, wherein, the spring contacts project into an open end of the mouth.

8. An electrical connector as recited in claim 6 comprising: conductive pads on the shroud for connection to a circuit board.

9. An electrical connector as recited in claim 6, wherein, the contacts are arranged in two rows within the mouth, and the conductive surface of the card extend along two exterior surfaces of the card, the exterior surfaces being beside the contacts in respective rows of the contacts and providing a low impedance return path beside each of the contacts.

10. An electrical connector comprising: an insulative housing with two rows of contacts extending in a card receiving mouth in the housing, a conductive shroud encircling the housing, a ground reference plane on plate sections of the shroud extending along external surfaces of the housing parallel to respective rows of the contacts, spring contact fingers extending from each plate section into the mouth, the spring contact fingers being spaced apart from the contacts to engage frictionally against flat surfaces of a card received by the mouthy, and to connect electrically the plate sections with the flat surfaces of a card when the flat surfaces of the card are conductive electrically, whereby the flat surfaces of the card extend the ground reference plane into the mouth, and a card receiving space between the spring contact fingers and the contacts in the mouth, the card receiving space being widened by a card in the card receiving space biasing the spring contact fingers away from the contacts.

11. An electrical connector as recited in claim 10, wherein, the contacts are arranged in two rows within the mouth, and the flat surfaces of the card extend along two exterior surfaces of the card, the exterior surfaces being beside the contacts in respective rows of the contacts and providing a low impedance return path beside each of the contacts.

* * * * *

UNITED STATES PATENT AND TRADEMARK OFFICE
CERTIFICATE OF CORRECTION

PATENT NO. : 5,288,247
DATED : February 22, 1994
INVENTOR(S) : John Wilson Kaufman It is certified that error appears in the above-identified patent and that said Letters Patent is hereby corrected as shown below:

Column 5,
Claim 1, Line 11 - "receiving" should be --received--
Column 6,
Claim 10, Line 11 - "mouthy" should be --mouth--

Signed and Sealed this

Eighteenth Day of April, 1995

*Attest:*

BRUCE LEHMAN

*Commissioner of Patents and Trademarks*

*Attesting Officer*